United States Patent [19]

Altman et al.

[11] Patent Number: 4,700,330

[45] Date of Patent: Oct. 13, 1987

[54] MEMORY FOR A DIGITAL DATA PROCESSING SYSTEM INCLUDING CIRCUIT FOR CONTROLLING REFRESH OPERATIONS DURING POWER-UP AND POWER-DOWN CONDITIONS

[75] Inventors: Barbara H. Altman, Hudson; William F. Bruckert, Northboro; Alfred J. Dellicicchi, Acton, all of Mass.

[73] Assignee: Digital Equipment Corporation, Maynard, Mass.

[21] Appl. No.: 792,756

[22] Filed: Oct. 30, 1985

[51] Int. Cl.[4] ........................ G11C 13/00; G06F 13/00

[52] U.S. Cl. ........................ 365/222; 364/900

[58] Field of Search ........................ 364/200, 900; 365/222

[56] References Cited

U.S. PATENT DOCUMENTS

| | | | |
|---|---|---|---|
| 4,050,097 | 9/1977 | Miu et al. | 364/200 |
| 4,053,946 | 10/1977 | Opittek et al. | 364/200 |
| 4,084,232 | 4/1978 | Woods et al. | 364/200 |
| 4,158,883 | 6/1979 | Kadono et al. | 364/200 |
| 4,172,282 | 10/1979 | Aichelmann, Jr. et al. | 364/200 |
| 4,185,323 | 1/1980 | Johnson et al. | 365/222 |
| 4,204,254 | 5/1980 | Muzzani et al. | 364/200 |
| 4,228,496 | 10/1980 | Katzman et al. | 364/200 |
| 4,249,247 | 2/1981 | Patel | 364/900 |
| 4,254,464 | 3/1981 | Byrne | 364/200 |
| 4,316,401 | 2/1982 | Retter | 364/200 |
| 4,317,169 | 2/1982 | Panepinto, Jr. et al. | 364/200 |
| 4,319,323 | 3/1982 | Ermolovich et al. | 364/200 |
| 4,386,401 | 5/1983 | O'Brien | 364/200 |
| 4,423,482 | 12/1983 | Hargrove et al. | 364/200 |
| 4,481,578 | 11/1984 | Hughes et al. | 364/200 |

*Primary Examiner*—Gareth D. Shaw
*Assistant Examiner*—Randy W. Lacasse
*Attorney, Agent, or Firm*—Cesari and McKenna

[57] ABSTRACT

A memory for use in a digital data processing system, the memory including a memory controller and one or more memory arrays. A memory array performs refresh operations transparently to the memory controller, but in synchronization with a system timing signal while it is receiving normal system power. A memory array also includes asynchronous refresh circuitry for controlling refresh while the system power is interrupted and the array receives no system timing signal. When each refresh operation occurs during power interruption, the asynchronous refresh circuitry tests the condition of the system power supply. Since refresh operations are transparent to the memory controller, the memory array indicates when the memory operations are completed. If the memory operation is a read operation, the memory controller then controls the transfer of data from the array to the controller.

17 Claims, 6 Drawing Figures

MEMORY ARRAY 16
ADRS
ARRAY STORAGE LOCATIONS 50
RD/WR EN
DATA
ADDRESS DECODER
52
CTRL LOGIC 54
DATA BUFFER 56
CLK
DØ-3 TO ARY
DATA FRM ARY
S1
SØ
67
DATA
55
ARY ADRS
51
WRT DAT VAL
ARY START
ARY AVAIL
ARY SHIFT
ARY WRT EN
BLOCK SIZE
ARY RD DAT EN
RD BZY
ARY SEL
SYS CLK
ARY DC OK L
ARY 5V OK L
ARRAY BUS 17
65
64
63
62
57
53
60
66
61
67
68
69

MEMORY FOR A DIGITAL DATA PROCESSING SYSTEM INCLUDING CIRCUIT FOR CONTROLLING REFRESH OPERATIONS DURING POWER-UP AND POWER-DOWN CONDITIONS

BACKGROUND OF THE INVENTION

1. Field of the Invention

The invention relates generally to the field of digital data processing systems, and more specifically to memories for use in such systems that include dynamic random access memory circuit chips that are typically provided in modern digital data processing systems and which periodically must be refreshed to maintain the data stored therein.

2. Description of the Prior Art

A digital data processing system generally includes three basic elements; namely a memory element, an input/output element, and a processor element, all interconnected by one or more buses. The memory element stores data in addressable storage locations. This data includes both operands and instructions for processing the operands. The processor element causes data to be transferred or fetched to it from the memory element, interprets the incoming data as either instructions or operands, and processes the operands in accordance with the instructions. The results are then stored in addressed locations in the memory element. An input/output element also communicates with the memory element in order to transfer data into the system and to obtain the processed data from it. The input/output elements normally operate in accordance with control information supplied to them by the processor element. The input/output elements may include, for example, printers, teletypewriters, or keyboards and video display terminals, and may also include secondary data storage devices such as disk drives or tape drives.

Modern memories provide a number of individually addressable storage locations in dynamic random access memories (RAMs), with each addressable location comprising several, for example, eight, bit (for "binary digit") storage locations. The random access memories are formed from a plurality of integrated circuit chips, with each chip storing one bit of a number of eight-bit byte storage locations. In most known modern memories, the smallest individually-addressable location comprises an eight-bit byte. Each bit storage location of a dynamic RAM is essentially a transistor amplifier having a large internal capacitance, with the presence of an electrical charge in the capacitance indicating, for example, the value "1", and the absence of a charge indicating the binary value of a "0".

Typically, when a storage location is read, the charge condition of the capacitance is destroyed, and the reading circuitry in the dynamic RAM chip includes circuitry that restores the charge to the level prior to the read operation. Over time, however, even in the absence of reading operations, the charge levels in the capacitances may decrease due to leakage, and so they must be restored, that is, "refreshed", to maintain the integrity of the charge, and thus of the value, representing the data stored in the location. Therefore, memories which incorporate dynamic RAM chips have refresh circuitry which iteratively essentially enables the chips to read the locations in the chips, with the on-chip reading circuitry restoring the charge levels to maintain them at minimum levels. Over a period of time, the refresh circuitry enables all of the locations in the RAM chips to be so refreshed.

While system power is on to the entire digital data processing system including the memory, the refresh operation takes place in synchronism with a global system clock that synchronizes operations throughout the entire data processing system. Recently, high performance data processing systems have been provided with an auxilliary power system comprising a battery at least for the memory so that, in case the normal system power fails, the data stored in the memory chips will not be lost. To conserve battery power, the battery power is applied only to the memory and not to the entire system. In that case, however, no system clock is provided to synchronize or time the refresh operation.

SUMMARY OF THE INVENTION

The invention provides a new and improved memory in which the array performs refresh operations that are synchronised to the system clock during normal power operations and that are performed periodically while normal power is interrupted, resulting in interruption of the system clock signal, and an auxiliary power supply such as a battery back-up provides power to the array. In addition, the refresh operations are transparent to the controller and the memory controller-array communication protocol accommodates potential delays in the array's processing of read or write operations due to refresh operations.

In brief summary, a memory array has internal refresh timing circuitry which periodically enables a refresh operation to occur. During normal power conditions, when the memory controller initiates a read or write operation with the array memory, if a refresh operation is contemporaneously enabled, circuitry on the array inhibits either the refresh operation or the read or write operation, depending on which was initiated first, and allows the other to proceed. After the conclusion of the operation which proceeded first, the other operation is allowed to proceed.

The array includes timing circuitry that operates in response to a global system timing signal from a memory controller to generate various control timing signals. The control timing signals enable the generation of various control signals that, during the read and write operations, control the operation of random access memory (RAM) chips that contain the addressable storage locations. During normal power conditions, the memory array also generates the control timing signals during refresh operations and uses them to generate the RAM control signals to control the operation of the RAM chips.

When the power supply is interrupted, the system timing signal is also interrupted. Circuitry on the array, under battery back-up power, generates the RAM control signals that enable refresh operations to occur on the RAM chips. When normal power supply operations are restored, the system timing signal is restored and the control timing signals are again generated on the array in response thereto. These control timing signals thereafter control the generation of the RAM control signals.

When the memory controller initiates an operation with the memory array, it transmits address and control signals, and data signals if the operation is a write operation, to the array. The memory array latches these signals even if a refresh operation is occurring and negates an array available signal to the controller which, when asserted, indicates that it is available to perform a read or write operation. If the operation requested by the controller is a read operation, the array also asserts a read busy signal.

The array available signal remains negated and, if a read operation is occurring, the read busy signal remains asserted until a selected number of ticks of the system clock signal in advance of the completion of the operation.

If the current operation is a write operation, when the array available signal is asserted, the memory controller may then prepare to initiate another operation with the array. If the current operation is a read operation, when the read busy signal is negated, the controller establishes data paths from the array to the controller so that, when the read data is available at the interface between the controller and array it may immediately receive the data.

The number of ticks of the system clock signal by which the negation of the read busy signal precedes the availability of the data is selected to permit the controller to set up its internal data paths to receive the read data. If either a read operation or a write operation is delayed by a refresh operation, the reassertion of the array available signal is also delayed, and, in the case of a read operation, the negation of the read busy signal is also delayed. Thus, the refresh operation is transparent to the memory controller.

BRIEF DESCRIPTOIN OF THE DRAWINGS

The invention will be pointed out with particularity in the appended claims. The above and other advantages of the invention may be better understood by referring to the following description taken in conjunction with the accompanying dawings, in which:

DESCRIPTION OF AN ILLUSTRATIVE EMBODIMENT

1. General Discussion

Figure 1:
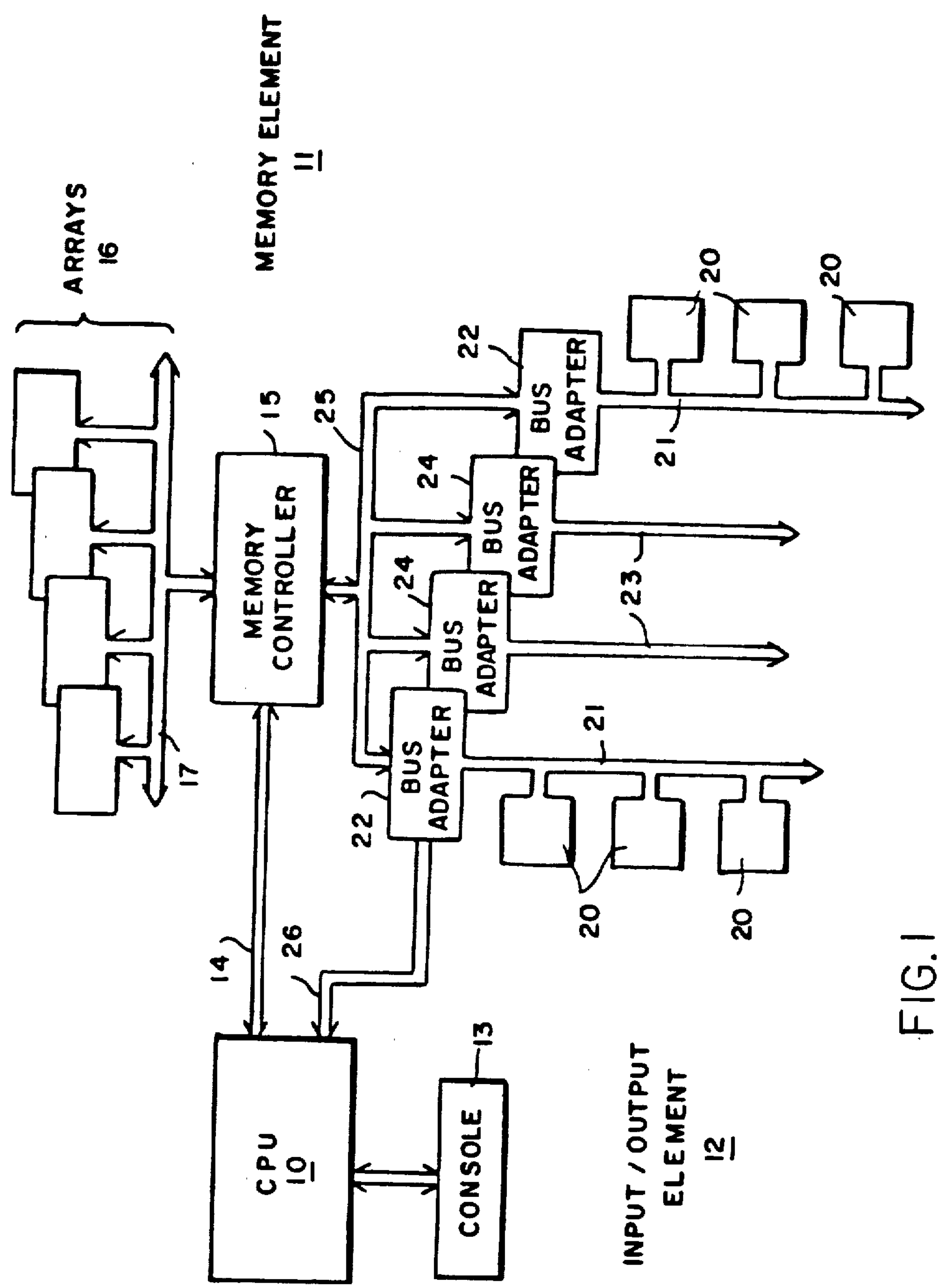
FIG. 1 is a general block diagram of a digital data processing system which incorporates memories that are constructed in accordance with the invention.

As exemplified in FIG. 1, the basic elements of a data processing system including the invention comprise a central processor unit (processor) 10, a memory element 11, and an input/output element 12. The processor 10 executes instructions that are stored in addressable storage locations in the memory element 11. The instructions identify operations that are to be performed on operands, which are also stored in addressable locations in the memory element. The instructions and operands are fetched by the processor 10 as they are needed, and processed data are returned to the memory element. The processor 10 also transmits control information to units in the input/output element, enabling them to perform selected operations, such as transmitting data to or retrieving data from the memory element 11. Such data may be instructions, operands which may be transmitted to the memory element or processed data which is retrieved from the memory for storage or display.

An operator's console 13 serves as the operator's interface. It allows the operator to examine and deposit data, halt the operation of the central processor unit 10, or step the central processor unit through a sequence of instructions and determine the responses of the processor in response thereto. It also enables an operator to initialize the system through a boot strap procedure and perform various diagnostic tests on the entire data processing system.

The central processor unit 10 is connected to the memory element 11 through several buses generally identified by the reference numeral 14. Specifically, the central processor unit 10 is directly connected to a memory controller 15, which, in turn, connects to a plurality of arrays 16 over an array bus 17. In one specific embodiment, the memory controller also houses a cache memory. Memory controller 15 includes circuitry for retrieving the contents of an addressed location from either the cache or the array 16 and for storing information therein in a conventional manner. Cache memories are well-known in the art.

The data processing system may include several types of input/output units, including disk and tape secondary storage elements, teletypewriters, keyboards and video display terminals, and the like. These units 20 are connected through an input/output bus 21 to a bus adapter 22. The input/output bus 21 may be as described in U.S. Pat. No. 4,232,366, entitled "Bus for Data Processing System With Overlap Sequences" which was issued in the name of John V. Levy, et al, and assigned to the assignee of the present invention. Other types of input/output buses may also be used to connect to similar input/output units (not shown), including an input/output bus 23, connected to a bus adapter 24, which may be as described in U.S. Pat. No. 3,815,099, issued June 4, 1974, in the name of J. Cohen et al, and entitled "Data Processing System".

The bus adapters 22 and 24 are connected to transmit and receive data from memory controller 15 over an adapter bus 25. The bus adapters are also connected by an interrupt request/grant bus 26, over which the bus adapters can interrupt the processing of central processor unit 10 in the event of a change of status of one or more of the input/output units 20 in a conventional manner. The central processing unit 10 thus transfers interrupt request and interrupt grant signals directly with units in the input/output element, and transmits control information to, and receives status information from, the units in the input/output element 12 through memory controller 15. The memory controller thus controls the transfer of control and status information between the central processing unit and input/output element 12.

Figure 2:
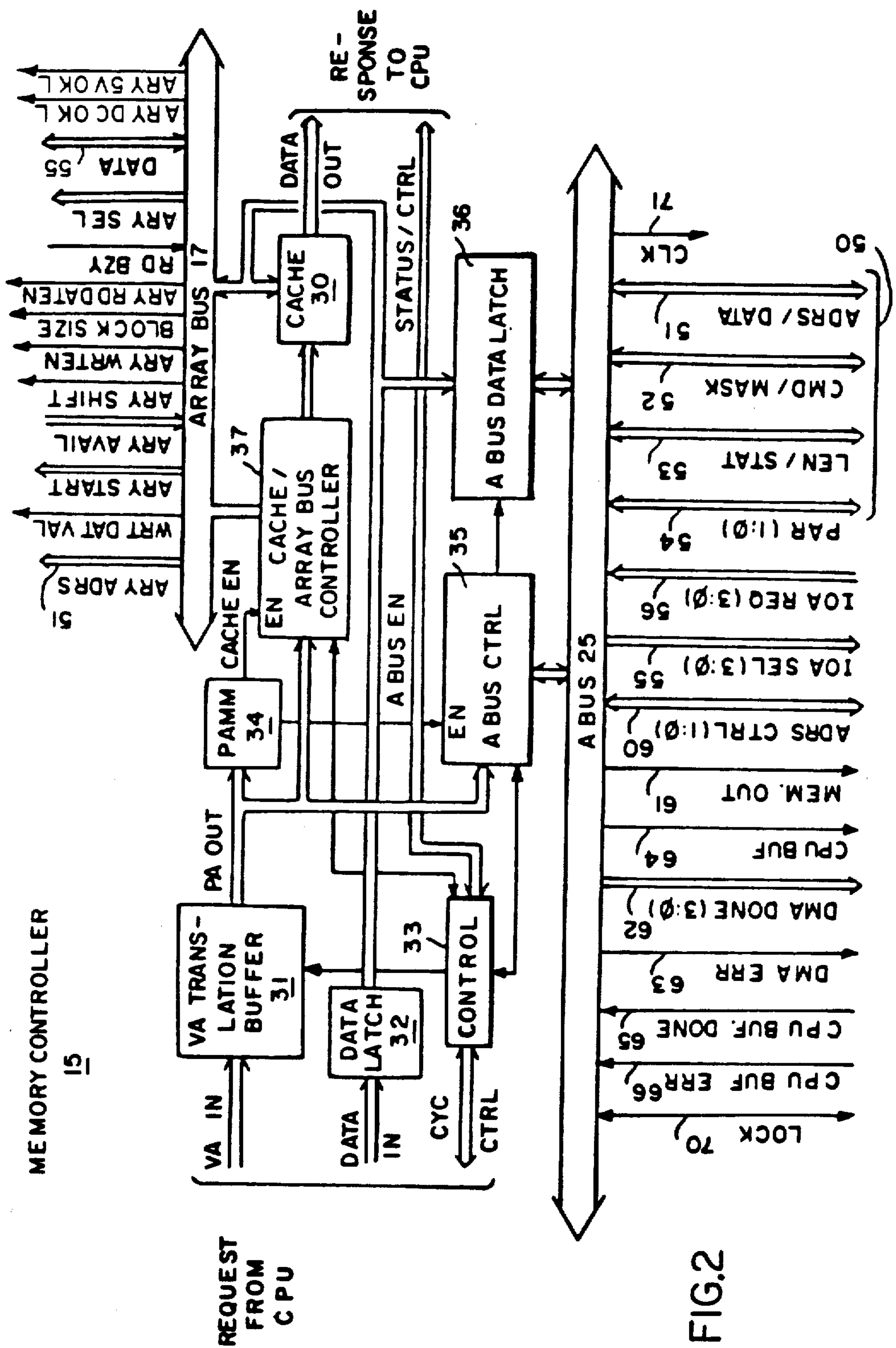
FIG. 2 is a block diagram of a memory controller included in the data processing system depicted in FIG. 1, and which is useful in an understanding of the invention.

With reference to FIG. 2, when memory controller 15 receives a memory request from central processor unit 10 (FIG. 1), it receives virtual address signals in a translation buffer 31, data signals in a data latch 32 if the transfer is a WRITE operation, and receives and transmits cycle control signals in a control logic circuit 33, the latter signals including timing signals, READ/WRITE operation enabling signals, acknowledgement signals and so forth. The translation buffer 31 translates the virtual address in a conventional manner and transmits PA OUT physical address signals to a physical address memory map 34. The physical address may identify a location either in a cache 30 or one of the arrays 16, on the one hand, or in the input/output element 12. If the PA OUT physical address signal identifies a location in input/output element 12, the physical address memory map 34 transmits an ABUS EN adapter bus enable signal, which enables control circuitry 35 and a data latch 36 to engage in a transfer over adapter bus 25. Transfers over one embodiment of adapter bus 25 are described in U.S. patent application Ser. No. 06/549,609, and will not be described further herein.

However, if the PA OUT physical address signals identify a location in cache 30 or one of arrays 16, the physical address memory map 34 transmits a CACHE EN cache enabling signal to a cache/array bus controller 37. Cache/array bus controller 37, in turn, determines whether the contents of the requested location is cached in cache 30 or if they are only in arrays 16. If the requested location is cached in cache 30, the controller 37 enables the cache to store the data from the data latch 32 if the operation is a WRITE operation, or, if the operation is a READ operation, to transmit the data from the requested location as DATA OUT signals to the central processing unit 10. The control logic 33 also transmits cycle control signals to the central processing unit.

Before proceeding further, it will be helpful to present a description of a cache 30 which is used in memory controller 15. A cache memory works on the principle that a central processor unit 10 normally will access (that is, read data from or write data into) memory locations adjacent or very near to locations which it has recently accessed. A cache typically contains a small number of storage locations, smaller, that is, than the number of storage locations in an array. The locations in the cache are accessible quickly and thus, if an item is in the cache, it can be transmitted to the central processing unit relatively quickly after the request is made. The storage locations in one embodiment of the cache 30 are divided into blocks with each block being able to accommodate a copy of the data stored in four contiguous locations in an array. The blocks in cache 30 are assigned addresses corresponding to the addresses in the array 16 from which the corresponding data was obtained. Controller 37 maintains a list of the array addresses of the blocks in cache 30, and thus can determine whether the requested locations are in the cache, or whether it will have to retrieve a block of data from array 16 and establish a block in the cache for the requested data.

When a central processor unit 10 retrieves data from the memory element 11, if the cache/array bus controller 37 finds that the requested data is not in cache 30, it will initiate a transfer over array bus 17 to transfer data around the requested location from array 16 sufficient to fill an entire block in the cache. This data is stored in the cache, and the data from the addressed storage location is transmitted to the central processor unit. If the central processor unit then reads an adjacent location, the cache/array bus controller 37 will probably find the data from the requested location in the cache. In that case, no transfer from the array will be required to complete the READ operation.

When data is written into the memory by the central processor unit, the data is loaded into an addressed block in cache 30. Then one of two operations can occur. If the cache 30 is a "write-through" cache, cache/array bus controller 37 also immediately enables the data word to be written into the addressed location in array 16. If the cache 30 is a "write-back" cache, each block contains a flag which indicates whether the central processing unit has written data into it. If data has been written into a block, controller 37 will at some point transmit the data from the entire block into the corresponding locations in arrays 16.

It can be seen that in transfers from cache 30 to arrays 16, during a "write-back" operation, blocks of data from four locations will normally be written into the arrays. However, on transfers from one embodiment of adapter bus 25, the block size is limited to one or two data words, with each data word being stored in one location in arrays 16. In that embodiment, normally two data words are transferred over the adapter bus. Thus, while the cache transfers blocks of four words to and from arrays 16, transfers over the adapter bus 25 to and from the arrays 16 normally occur in blocks of two data words.

Figure 3:
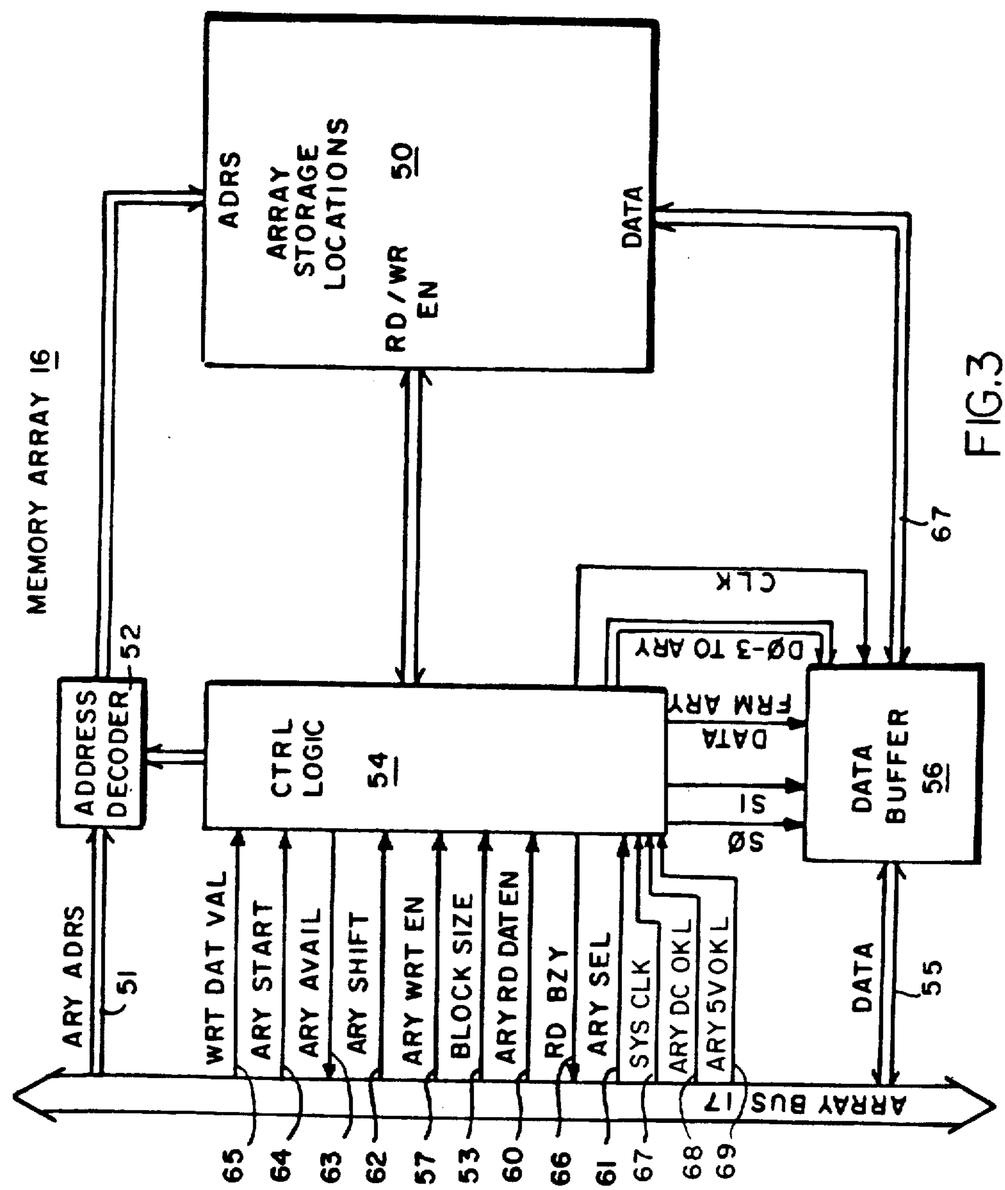
FIG. 3 is a block diagram of a memory array which is used with the memory controller depicted in FIG. 2 and FIG. 4, comprising

As has been mentioned, on accesses to memory element 11, if the physical address provided by translation buffer 31 does not identify a location in a block in cache 30, the cache/array bus controller 37 will perform a read or write operation over array bus 17 with arrays 16. FIG. 3 illustrates a general block diagram of an array which may be used in connection with the memory controller 15 depicted in FIG. 2.

As shown in FIGS. 2 and 3, the array bus 17 connecting memory controller 15 and an array 16 includes a plurality of lines for carrying address, data and control signals. In one specific embodiment, the memory controller transmits ARY ADRS array address signals over lines 51 and a BLOCK SIZE signal over a line 53 which together identify the locations in the storage locations 50 into which the data will be written or from which data will be read. Address decoder 52, enabled by array control logic 54, enables the locations identified by the address signals. The BLOCK SIZE signal received identifies the number of contiguous words to be written or read. The data words to be stored in the storage location are transmitted by the controller 15 over lines 55 and received into a data buffer 56.

In addition to these signals, a number of other control signals are transmitted over array bus 17 to control logic 54. An ARY WRT EN array write enable signal on line 57 indicates whether the operation is a READ or WRITE operation. An ARY SEL array select signal on lines 61 enables one of the arrays to engage in a transfer; each of the plurality of arrays 16 (FIG. 1) connected to memory controller 15 has an associated ARY SEL signal. An ARY SHIFT array shift signal on line 62 enables control logic 54 to, in turn, enable data buffer 56 to shift data into the data buffer 56 from data lines 55 during a WRITE operation or to shift the data from buffer 56 onto data lines 55 during a READ operation. An ARY AVAIL array available signal on lines 63, each from one array 16, when asserted indicates to the controller 15 that the associated array is available for a new operation. The controller asserts an ARY START array start signal on one of lines 64, each of which is connected to one array, to indicate that the array that receives the asserted signal is to begin performing the transfer indicated on the other control lines. A WRT DAT VAL write data valid signal on line 65 is a control signal which is transmitted along with each data word. Its state determines whether that particular word will be written into the array. Control logic 54 uses it to gate the control signals to the array during a write operation.

Thus, if the signal is asserted, the accompanying data word will be written into a location in location 50, and when the signal is negated, the accompanying data word will not be written. Finally, a RD BZY read busy signal, transmitted by control logic 54 to memory controller 15 on line 66, when asserted, indicates that the array is in the process of retrieving data from an addressed location during a READ operation. The RD BZY signal is negated a selected number of ticks of a SYS CLK system clock signal before read data will be available to the memory controller, as detailed below. The SYS CLK system clock signal is provided to array 16 over line 67.

In addition to the above-described signals, the array 16 receives two status signals, namely, an ARY DC OK L array direct current (DC) OK (asserted low) signal on line 68 and an ARY 5V OK L array five volt OK (asserted low) signal on line 69. The ARY DC OK L signal is asserted (low) when the normal power from the system power supply (not shown) to the array is satisfactory and is otherwise negated. The ARY 5V OK L signal, when asserted, indicates that power to storage location 50 is satisfactory, whether it be provided by the system power supply or an auxiliary power supply such as a battery back-up.

During a WRITE operation from adapter bus 25 or cache 30 to the storage locations 50 on array 16 (FIG. 3), the array control logic 54 first enables all of the data words in the block being transferred to be accumulated in data buffer 56 from the array bus 17. After the entire block has been stored in the buffer, the control logic 54 enables them to be transmitted to storage locations 50. The number of data words in the block is indicated by the condition of the BLOCK SIZE signal on line 53. During a READ operation from storage locations 50 to the memory controller 15, the control logic 54 also enables a block of data to be transferred from storage locations 50 and stored in the data buffer 56 before it is transmitted onto array bus 17.

2. Detailed Description Of Array Operation (A) READ or WRITE Operations

Figure 4A:
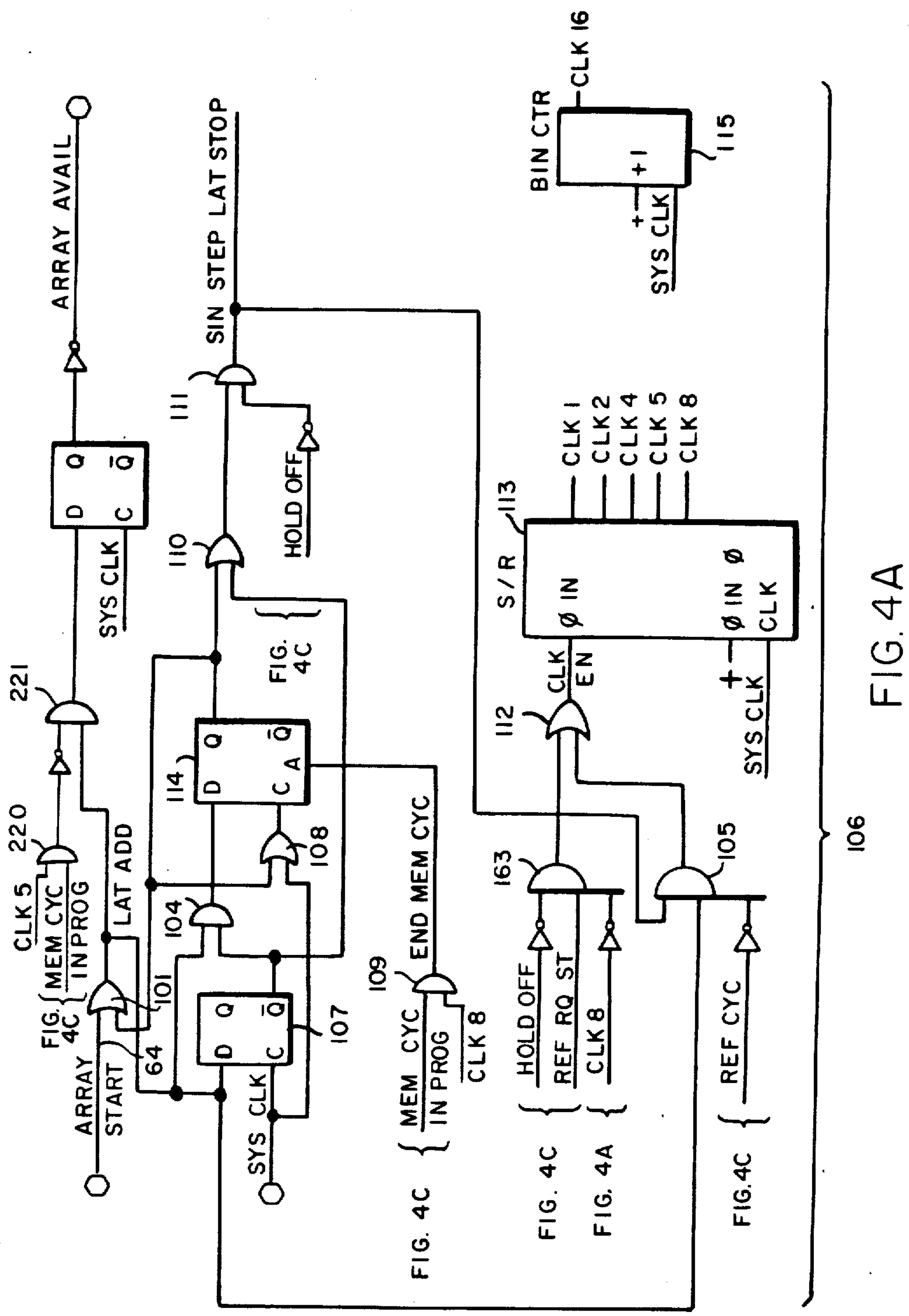
FIGS. 4A-4C is a detailed circuit diagram of a memory array useful in understanding the invention.
Figure 4B:
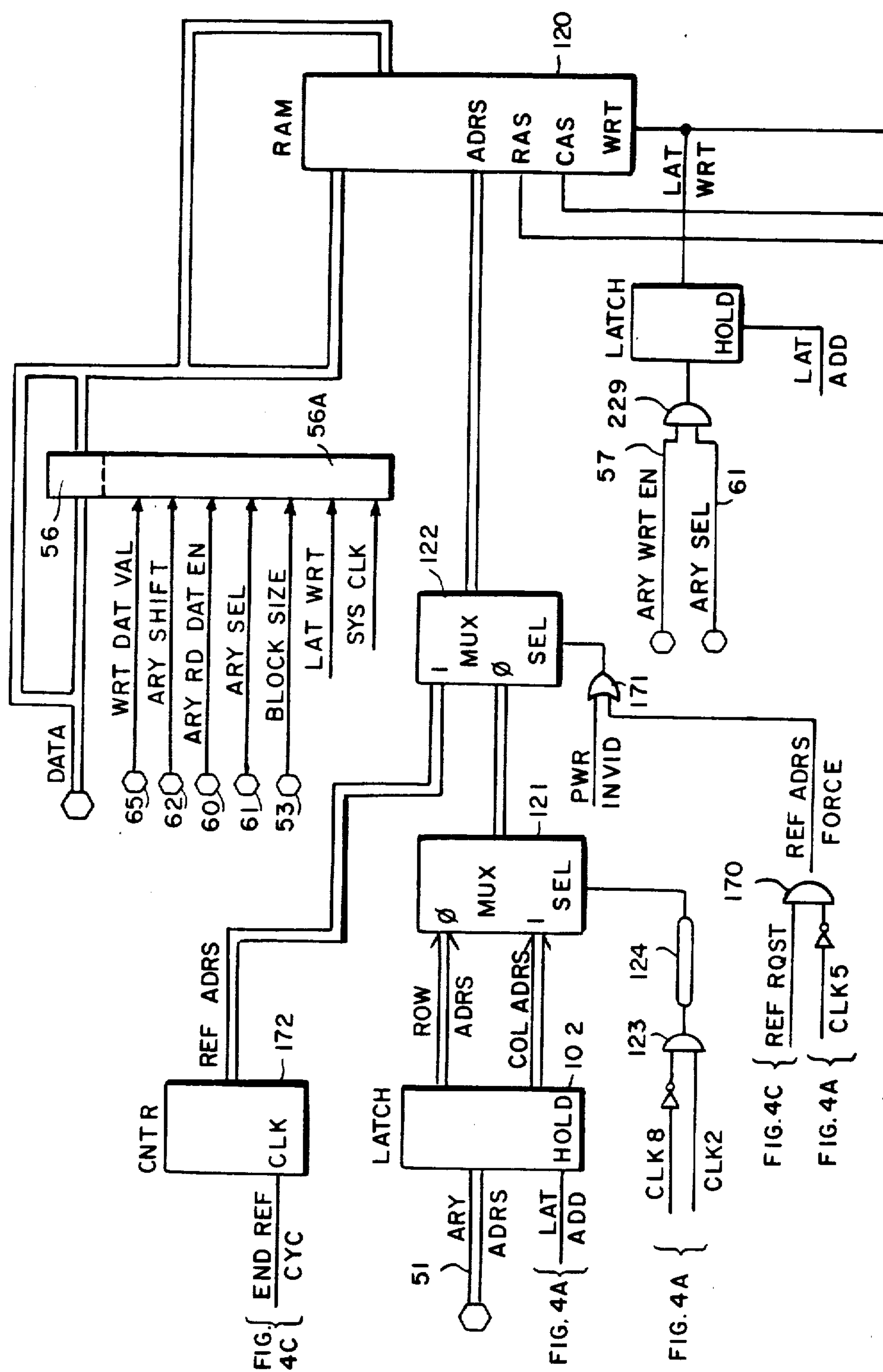
Figure 4B:
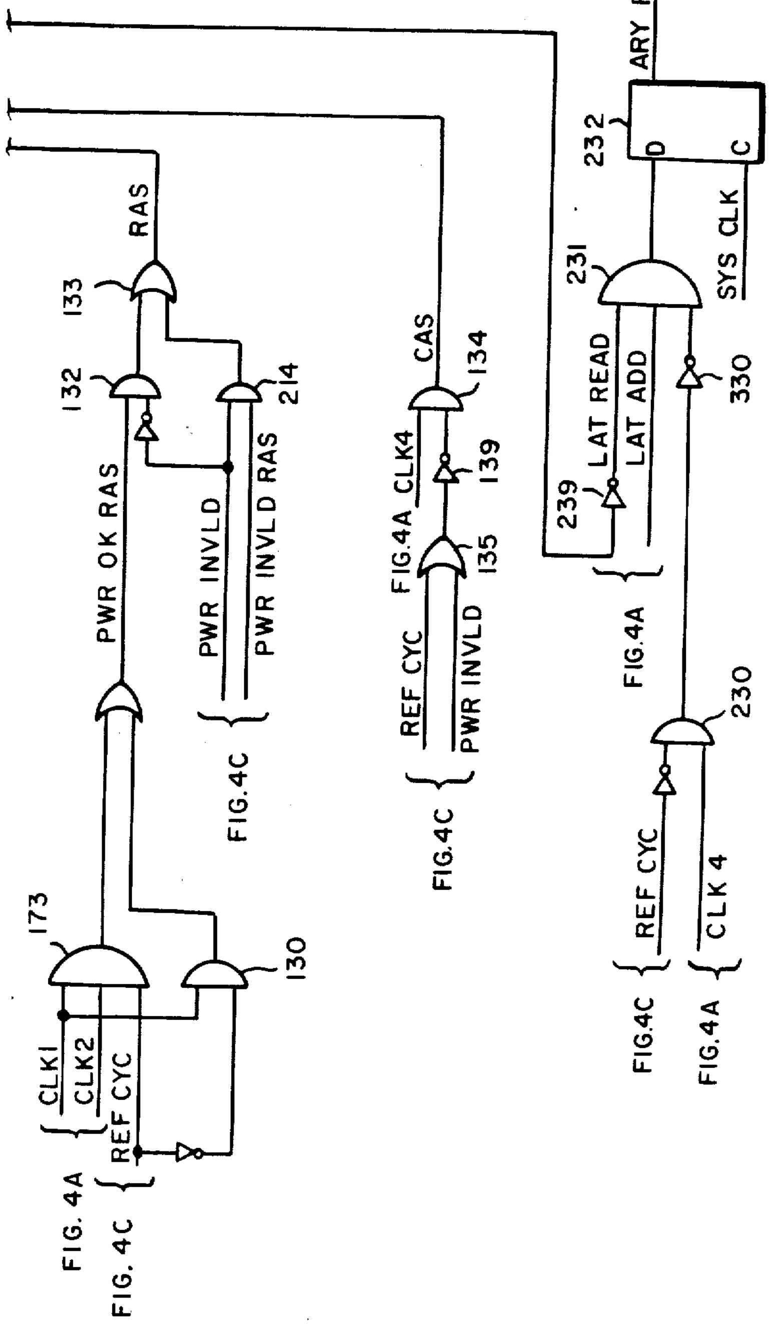

The detailed operations of a memory array 16 will be described in connection with FIGS. 3 and 4A through 4C. In brief, FIG. 4A depicts circuitry for generating timing signals in response to the ARY START array start and SYS CLK system clock signals. The timing signals are used, as explained below, to generate various control signals during the READ and WRITE operations initiated by the memory controller and the refresh operations while the normal system power is on. FIG. 4B depicts the circuitry comprising the storage locations in the form of random access memory integrated circuit chips, and circuitry for receiving and using ARY ADRS array address, DATA and various control signals from the memory controller 15. FIG. 4B also depicts circuitry for generating signals, synchronized to the timing signals generated by the circuitry depicted on FIG. 4A, for controlling the operation of the RAM chips and the transmission of data and address signals thereto. Finally, the circuitry depicted on FIG. 4C initiates a refresh operation and generates signals for controlling the operation of the RAM chips when normal sytem power is interrupted and the array 16 is being powered by a battery back-up.

With reference to FIGS. 3 and 4A through 4C, when the memory controller 15 initiates a WRITE memory operation, if the ARY AVAIL signal line 63 associated with the array containing the addressed location is energized, it places ARY ADRS array address signals on lines 51 (FIGS. 3 and 4B), DATA signals on lines 55 (FIGS. 3 and 4B) and WRT DAT VAL write data valid signal on line 65 (FIG. 3) as well as an ARY WRT EN array write enable signal on line 57 (FIGS. 3 and 4B), and energizes the ARRAY START signal line 64 (FIGS. 3 and 4A) and ARY SEL array select line 61 (FIGS. 3 and 4B) which are associated with the particular array 16 that includes the addressed storage location which is to be written. If the operation is a READ operation, the ARY RD DAT EN line 60 (FIGS. 3 and 4B) is initially not energized, the data lines 55 (FIGS. 3 and 4B) are empty and the WRT DAT VAL line 65 (FIGS. 3 and 4B), and ARY WRT EN line 57 (FIGS. 3 and 4B) are not energized.

In response to the energization of the array's ARRAY START line 64, an OR gate 101 asserts a LAT ADD latch address signal which enables a latch 102 (FIG. 4B) to latch the ARY ADRS array address signals on lines 51. If the operation is a WRITE operation, the asserted ARY WRT EN array write enable signal and asserted ARY SEL array select signal energize an AND gate 229 (FIG. 4B). When the LAT ADD latch address signal is asserted, a latch 103 (FIG. 4B) asserts a LAT WRT latch write signal. In a WRITE operation, the LAT WRT latch write signal, in conjunction with the ARY SEL array select, BLOCK SIZE, SYS CLK, and ARY SHIFT signals enable a buffer control circuit 56A to enable buffer 56 to latch the data to be written. In one embodiment the buffer operates as described in the above-mentioned U.S. patent application Ser. No. 06/549,609 and will not be described in detail herein.

Figure 4C:
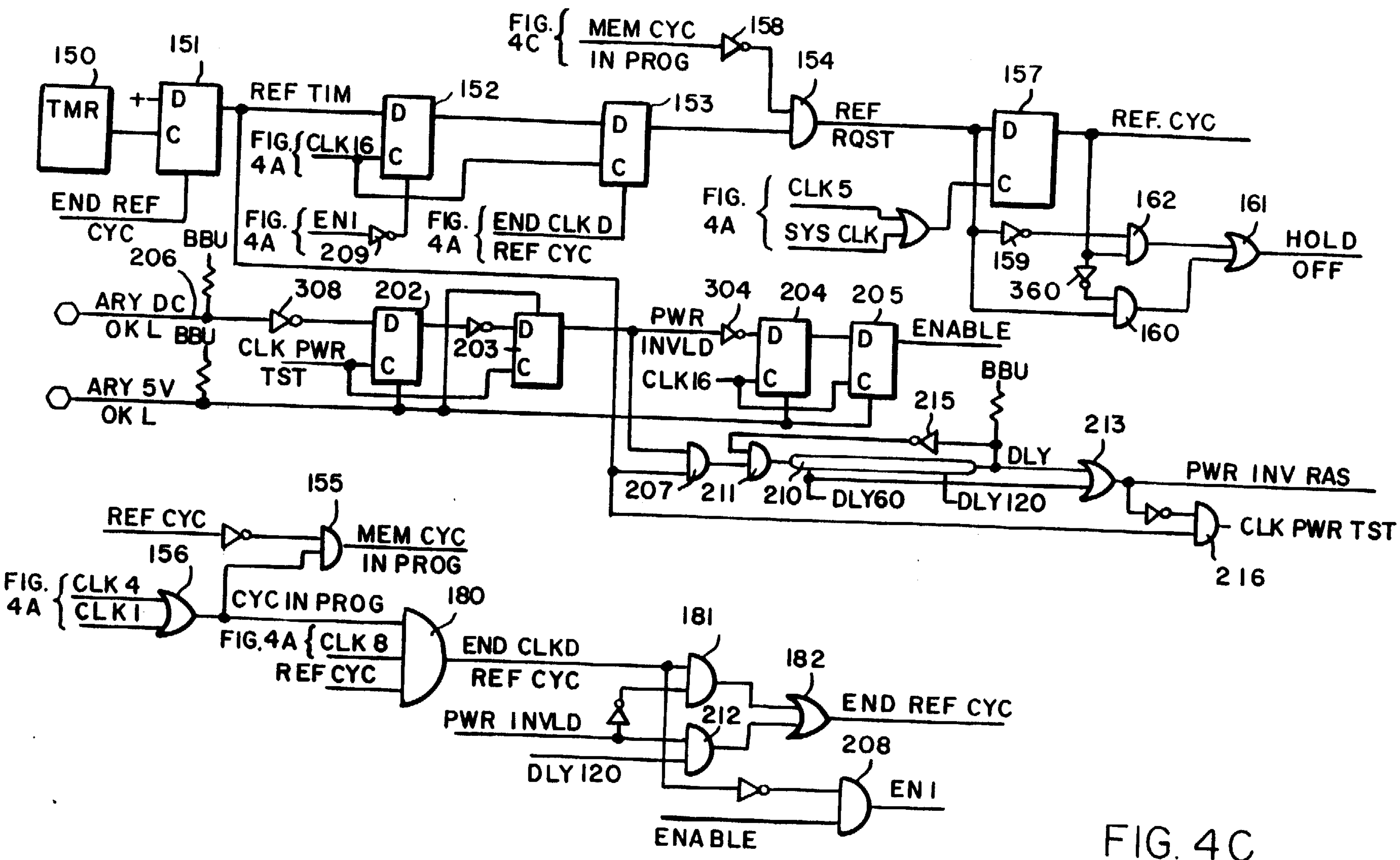

In addition, the LAT ADD latch address signal energizes one input of each of AND gates 104 and 105 of timing signal generating circuitry 106 (FIG. 4A). A flip-flop 107, which is initially in a reset condition, energizes an OR gate 110, which in turn energizes one input of an AND gate 111. If a refresh operation has not been initiated, as described below in connection with FIG. 4C, a HOLD OFF signal (from circuitry depicted on FIG. 4C) is not asserted. Accordingly AND gate 111 is energized to assert an SIN STEP LATSTOP signal, which in turn energizes a second input of AND gate 105. If a REF CYC refresh cycle signal from the refresh circuitry on FIG. 4C is also not asserted, as is the case when no refresh operation has been initiated, AND gate 105 is energized which, in turn, enables an OR gate 112 to assert a CLK EN clock enable signal. When the SYS CLK system clock signal is next asserted, the shift register 113 latches the asserted CLK EN signal from OR gate 112, and a CLK 1 timing signal is asserted.

Furthermore, since the flip-flop 107 is initially reset, the second input terminal of AND gate 104 is also initially energized. Thus AND gate 104 energizes the D data terminal of flip-flop 114. At the assertion of the SYS CLK signal, an OR gate 108 energizes the C clock terminal of the flip-flop 114, thereby setting it. The asserted output signal from the set flip-flop 114 continues to energize OR gate 108 notwithstanding changes in the condition of the SYS CLK system clock signal, until the flip-flop is reset by a signal at its direct-reset terminal R. Accordingly, the flip-flop 114 is in a set condition until reset by a signal at its direct reset terminal as explained below. In addition, the asserted output signal from flip-flop 114 maintains OR gate 101 in an energized condition, thus maintaining the LAT ADD latch address signal in an asserted condition, regardless of the condition of the ARRAY START signal from the memory controller 15, until flip-flop 114 is reset.

At the first assertion of the SYS CLK signal, flip-flop 107 is set, and so the second input terminal of AND gate 104 is deenergized, thereby de-energizing the AND gate 104. However, since the asserted output signal of flip-flop 114 is essentially preventing the flip-flop 114 from being clocked, the negation of the signal at the data input terminal of flip-flop 114 has no effect on its output signal.

Since at this time the flip-flop 107 is set, the input signal to OR gate 110 that is provided by flip-flop 107 is negated. However, since flip-flop 114 is energized, the second input signal to OR gate 110, which is provided by flip-flop 114, is asserted. Thus, OR gate 110 remains energized and so, as long as the HOLD OFF signal remains negated, the SIN STEP LATSTOP signal will remain asserted. Furthermore, as long as the REF CYC refresh time signal remains negated, AND gate 105 will remain energized for subsequent ticks of the SYS CLK system clock signal. Thus the shift register 113 shifts the CLK 2, CLK 4, CLK 5 and CLK 8 timing signals to asserted states at the respective ticks of the SYS CLK signal.

As has been noted, the flip-flop 114 remains set, and thus AND gate 105 remains energized, until a signal at its direct reset terminal is asserted. That signal is provided by an END MEM CYC end memory cycle signal, which is generated by an AND gate 109 in response to the coincidence of a MEM CYC IN PROG memory cycle in progress signal, which is generated while the array is performing a read or write operation, and a CLK 8 timing signal from shift register 113.

The circuitry for generating the MEM CYC IN PROG memory cycle in progress signal is depicted on FIG. 4C. With reference to FIG. 4C, if a refresh operation is not occurring, the REF CYC refresh cycle signal is negated and so the MEM CYC IN PROG signal is asserted by AND gate 155 when a CYC IN PROG cycle in progress signal is asserted by an OR gate 156. The OR gate 156 is energized when the CLK 1 signal is first asserted, and remain energized until the CLK 4 signal is negated. With reference again to FIG. 4A, when the CLK 8 signal from shift register 113 is asserted, since the MEM CYC IN PROG memory cycle in progress signal is asserted, AND gate 109 is energized to assert the END MEM CYC end memory cycle signal, which resets flip-flop 114.

In response to the resetting of flip-flop 114, OR gate 110 is de-energized, thereby de-energizing AND gate 111 and generating the SIN STEP LATSTOP signal. In response, the AND gate 105 is de-energized, de-energizing OR gate 112 and negating the CLK EN clock enabling signal. At the next tick of the SYS CLK system timing signal after flip-flop 114 is reset, the CLK 1 timing signal is negated by shift register 113, and at subsequent ticks of the SYS CLK signal the other timing signal are also negated. Thus, the timing signals CLK 1, CLK 2, CLK 4, CLK 5 and CLK 8 are each asserted for eight ticks of the SYS CLK system timing signal.

In addition to the CLK 1, CLK 2, CLK 4, CLK 5 and CLK 8 timing signals generated by shift register 113, timing circuitry 106 includes a binary counter 115 that generates a CLK 16 timing signal which is asserted for eight ticks of the SYSCLK system timing signal and then negated for the next eight ticks.

With reference to FIG. 4B, the array address from the memory controller 15, which has been latched in latch 102 in response to the assertion of the LAT ADD signal from OR gate 101 (FIG. 4A), includes, as is conventional, a high-order portion that comprises a row address and a low order portion that comprises a column address. Briefly, when a specific storage location in conventional random access memory integrated circuit chips represented by RAM 120 is being written or read, the row address signals are coupled to the RAM's address input terminals ("ADRS") first, and then the column address signals are coupled to the same address input terminals. When the row address signals have stabilized at the RAM's address input terminals, a RAS row address strobe signal enables the RAM to use the row address signals, and when the column address signals have stabilized at the address input terminals, a CAS column address strobe signal enables the RAM to use the column address signals. The RAM 120 also includes a WRT write input terminal which is energized when the location identified by the address signals is to be written, and de-energized when it is to be read. The data to be written is provided to RAM 120 at its DI data input terminals, and the data that is read is transmitted at its DO data output terminals.

To enable first the row and then the column address signals to be coupled to the RAM's address input terminals, a multiplexer 121 has "0" input terminals that are connected to receive the signals that correspond to the portion of the ARY ADRS array address signals comprising the row address that has been latched in latch 102, and "1" input terminals that are connected to receive the portion of the ARY ADRS array address signals that comprise the column address that is also latched in latch 102. Normally multiplexer 121 couples the signals at the "0" input terminals to its output terminals, but when a signal at its SEL select input terminal is asserted, the multiplexer couples the signals at the "1" input terminals to its output terminals. If a refresh operation is not in progress, and if a PWR INVLD power invalid signal is not asserted, a second multiplexer 122 couples the signals from the output terminals of multiplexer 121 to address input terminals of RAM 120. The PWR INVLD power invalid signal is generated in response to power test circuitry that is depicted on FIG. 4C and will be described below; the signal is asserted in response to an interruption of the normal power supply, if the auxiliary battery back-up power supply is providing power to the RAM 120, and is otherwise negated.

Initially, the CLK 2 timing signal is not asserted, so an AND gate 123 is not energized and the signal at the SEL select input terminal of multiplexer 121 is negated. In response, multiplexer 121 couples the ROW ADRS row address signals from latch 102 to its output terminals. If a refresh operation is not in progress, and if the system power supply is not interrupted, multiplexer 122 couples these signals to the address input terminals of RAM 120.

The RAS row address strobe signal for RAM 120 is provided as follows. Since no refresh operation is in progress, the REF CYC refresh cycle signal, which is generated by refresh timing circuitry on FIG. 4C, is negated. When the CLK 1 timing signal is asserted an AND gate 130 is energized. AND gate 130 in turn enables an OR gate 131 to assert a PWR OK RAS power OK row address strobe signal. The PWR OK RAS signal enables one input of an AND gate 132. Since the normal system power suoply is not interrupted, the PWR INVLD signal is negated and so the AND gate 132 is energized. The AND gate 132, in turn, energizes an OR gate 133 to assert the RAS row address strobe signal which is transmitted to the RAS input terminal of RAM 120. When the RAS row address strobe signal shifts to the asserted state, RAM 120 is enabled to strobe in the signals at its address input terminals as row address signals.

The column address signals are provided by multiplexer 121 to RAM 120 as follows. When the CLK 2 timing signal is first asserted, the CLK 8 timing signal is negated, and so AND gate 123 is energized. A selected time later, as determined by the delay period of a delay line 124, the signal at the SEL select terminal of multiplexer 121 is asserted, and so multiplexer 121 couples the COL ADRS column address signals to input terminals of multiplexer 122. The delay period of delay line 124 is provided to ensure that RAM 120 has completely strobed in the row address signals and also to ensure that the column address signals have settled at the address input terminals of RAM 120 before the CAS column address strobe signal is asserted, as explained below. Since the signal at the SEL select terminal of multiplexer 122 is unchanged, multiplexer 122 couples the column address signals to the address input terminals of RAM chips 120.

The CAS column address strobe signal is asserted as follows. If the REF CYC refresh cycle signal and PWR INVLD power invalid signals are both negated, OR gate 135 is de-energized. An inverter 139 thus energizes one input terminal of an AND gate 134. When the CLK 4 timing signal is next asserted, the AND gate 134 asserts a CAS column address strobe signal which is transmitted to a CAS input terminal on RAM 120, enabling the RAM to strobe in the signals at its address terminals as column address signals.

The WRT write enable terminal of RAM 120 is provided with a LAT WRT latched write signal as follows. Depending on whether the ARY WRT EN array write enable signal was asserted or negated when the LAT ADD latch address signal from OR gate 101 (FIG. 4A) was asserted, the output signal of a latch 103 (FIG. 4) is similarly asserted or negated. The LAT WRT signal is coupled to a WRT write enable terminal of RAM 120. If the LAT WRT signal is asserted, RAM 120 stores the data representative of the signals latched in buffer 56 in the location identified by the address signals, otherwise it transmits data from the identified location to the buffer 56.

(B) Refresh Operations Under Normal System Power

With reference to FIG. 4C, when a timer 150 generates an asserted output signal, which occurs asynchronously with the SYS CLK system timing signal (FIG. 4A), a flip-flop 151 is set which causes a REF TIM refresh time signal to be asserted to enable the data input terminal of a flip-flop 152. When the CLK 16 timing signal from binary counter 115 (FIG. 4A) is next asserted, the flip-flop 152 is set, which enables the data input terminal of a second flip-flop 153. When the CLK 16 timing signal is again asserted, flip-flop 153 is also set. If memory controller 15 has not already initiated a read or write operation, a MEM CYC IN PROG memory cycle in progress signal is not asserted and an inverter 158 energizes one input of an AND gate 154, so that when the flip-flop 153 is set, AND gate 154 is energized.

When AND gate 154 is energized, it asserts a REF RQST refresh request signal, which enables the data input terminal of a flip-flop 157. Flip-flop 157 is initially in a reset condition when the REF RQST signal is asserted, and so its output, an REF CYC refresh cycle signal, is negated. While the REF RQST refresh request signal is asserted and the REF CYC refresh cycle signal is negated an AND gate 160 is energized, in turn energizing an OR gate 161 to assert the HOLD OFF signal. The asserted REF RQST refresh request signal also disables an AND gate 162 through an inverter 159. On the next tick of the SYS CLK signal after the assertion of the REF RQST refresh request signal, the flip-flop 157 is set, thereby asserting the REF CYC refresh cycle signal and de-energizing AND gate 160 through an inverter 360. Since the REF RQST signal remains asserted, AND gate 162 remains de-energized, thus the OR gate 161 is de-energized, thereby negating the HOLD OFF signal. The HOLD OFF signal is thus asserted, at the beginning of a refresh operation, only until the first tick of the SYS CLK system clock signal after the REF RQST refresh request signal is asserted.

The REF RQST refresh request, REF CYC refresh cycle and HOLD OFF signals are used by the timing circuitry 106 (FIG. 4A) as follows. During the cycle in which the HOLD OFF signal is asserted, it disables AND gate 111 (FIG. 4A) and so the SIN STEP LATSTOP signal is negated regardless of the condition of OR gate 110. As a result, the AND gate 105 remains de-energized even if the ARRAY START signal shifts to the asserted state. At the next tick of the SYS CLK signal, the HOLD OFF signal is negated, but, since the REF CYC signal then shifts to the asserted state, AND gate 105 is in its deenergized state even though the SIN STEP LATSTOP signal may now be asserted.

Furthermore, the REF RQST signal is asserted and the CLK 8 signal is negated, so that the negation of the HOLD OFF signal on the next tick of the SYS CLK system timing signal after the assertion of the REF RQST refresh request signal causes the AND gate 163 to be energized. The energization of AND gate 163 enables OR gate 112 to couple an asserted CLK EN clock enable signal to the data input terminal of shift register 113, which signal is latched at the next tick of the SYS CLK system timing signal to assert the CLK1 timing signal. It will be appreciated by those skilled in the art that the CLK1 timing signal is asserted two ticks of the SYS CLK timing signal after the assertion of the REF RQST refresh request signal, and thus one tick of the SYS CLK signal after the assertion of the REF CYC refresh cycle signal. The AND gate 163 remains energized until the CLK 8 timing signal is asserted by shift register 113. Thus, during a refresh operation the CLK n (n=1, 2, 4, 5 and 8) timing signals are each asserted for eight ticks of the SYS CLK system timing signal, in a similar manner as occurs during the read and write operations initiated by memory controller 15.

In response also to the assertion of the REF RQST refresh request signal by AND gate 154 (FIG. 4C) and until the CLK 5 timing signal is asserted by shift register 113 (FIG. 4A), an AND gate 170 (FIG. 4B) is energized to assert an REF ADRS FORCE refresh address force signal. AND gate 170 is enabled by the negated CLK 5 timing signal, and is energized when the REF RQST signal is asserted. When the CLK 5 timing signal is asserted, the AND gate 170 shifts to a de-energized state. The asserted REF ADRS FORCE refresh address force signal energizes an OR gate 171 which, in turn energizes the SEL select input terminal of multiplexer 122. The multiplexer 122 is thus enabled to couple REF ADRS refresh address signals from a refresh address counter 172 to the address input terminals of RAM 120.

The generation of the RAS row address strobe and CAS column address strobe signals during refresh operations under normal system power is accomplished as follows. The assertion of the REF CYC refresh cyle enables an AND gate 173. When both the CLK 2 timing signal is asserted, since the CLK 1 timing signal is by then already asserted, the AND gate 173 is energized thereby enabling OR gate 131 to assert the PWR OK RAS power OK row address strobe signal. Since the PWR INVLD power invalid signal is not asserted during refresh under normal system power, AND gate 132 is energized and OR gate 133 is enabled to couple the RAS row address strobe signal to the row address strobe input terminal of RAM 120. AND gate 173 is deenergized by the negation of the CLK 1 timing signal, which in turn de-energizes OR gate 131 resulting in the negation of the PWR OK RAS signal, thus de-energizing gates 132 and 133 and negating of the RAS row address strobe signal. The assertion of the REF CYC refresh cycle signal also energizes an OR gate 135 (FIG. 4B) disabling the AND gate 134 through inverter 139, and so the CAS column address strobe signal is not asserted, as is typical of refresh operations.

With reference again to FIG. 4C, when either the CLK 1 or the CLK 4 timing signal is asserted, an OR gate 156 asserts the CYC IN PROG cycle in progress signal. The coincidence of the CYC IN PROG and REF CYC refresh cycle signals disables AND gate 155, and so the MEM CYC IN PROG memory cycle in progress signal is not asserted during a refresh operation. The coincidence of the CYC IN PROG and REF CYC signals enables an AND gate 180, which is energized to assert an END CLKD REF CYC end clocked refresh cycle signal when the CLK 8 timing signal is asserted. During refresh operations under normal system power the PWR INVLD power invalid signal is negated, which enables an AND gate 181 which in turn is energized when the END CLKD REF CYC signal is asserted. Thus, when the END CLKD REF CYC signal is asserted, the AND gate 181 is energized to, in turn, energize an OR gate 182 causing the assertion of an END REF CYC end refresh cycle signal. The asserted END CLKD REF CYC signal also disables an AND gate 208, negating an EN 1 enabling signal.

The assertion of the END CLKD REF CYC end clocked refresh cycle signal causes the resetting of flip-flop 153. The assertion of the END REF CYC signal by OR gate 182, resets flip-flop 151 and the negation of the EN 1 signal by AND gate 208 resets flip-flop 152. Accordingly, the refresh initiating circuitry depicted on FIG. 4C is in condition to initiate a subsequent refresh operation on the timing out of timer 150. The assertion of the END REF CYC signal also clocks the refresh address counter 172 (FIG. 4B), causing it to increment and provide a new refresh address for the next refresh operation. All of these operations occur in response to the assertion of the CLK 8 timing signal energizing AND gate 180 (FIG. 4C). When flip-flop 153 (FIG. 4C) is reset, AND gate 154 is deenergized, thereby negating the REF RQST refresh request signal. However, flip-flop 157 remains set, and the REF CYC refresh cycle signal asserted, until one tick of the SYS CLK system timing signal after the CLK 5 timing signal is negated, that is, at the fourteenth tick of the SYS CLK system timing signal after the beginning of the refresh operation.

The negation of the REF RQST refresh request signal at the assertion of the CLK 8 timing signal enables an AND gate 162 through inverter 159. Since the REF CYC refresh cycle signal is being held asserted by flip-flop 157 by the asserted CLK 5 timing signal, AND gate 162 is energized, enabling OR gate 161 to again assert the HOLD OFF signal. Accordingly, the HOLD OFF signal is asserted beginning with the assertion of the CLK 8 timing signal, thereby to disable AND gate 111 (FIG. 4A). The HOLD OFF signal remains asserted until the flip-flop 157 is again reset. The resetting of flip-flop 157 negates the REF CYC refresh cycle signal, which in turn disables AND gate 162 causing the negation of the HOLD OFF signal.

It will be appreciated that, while a refresh operation is occurring, the circuitry depicted on FIGS. 4A and 4B may latch signals from the controller 15 (FIG. 1) initiating a read or write operation, and after the REF CYC, REF RQST and HOLD OFF refresh signals are all negated terminating the refresh operation, proceed with the read or write operation. Thus, after the refresh signals have been negated, AND gates 111 and 105 (FIG. 4A) may be energized as described above in connection with read and write operations to thereby enable timing generator 106 to generate the necessary timing signals. Multiplexers 121 and 122 are enabled to couple row and column address signals to RAM 120 and the RAS and CAS row and column address strobe signals are asserted by OR gate 133 and AND gate 134 (FIG. 4B) as described above in connection with read and write operations.

(C) Refresh Under Interruption of Normal Power Conditions

With reference again to FIG. 4C, the memory controller 15 (FIG. 1) transmits two power status signals to array 16, including an ARY DC OK L array direct current OK (asserted low) signal, and an ARY 5V OK L array five volts OK (asserted low) signal. As long as power is being supplied to RAM 120 by either the normal system power supply or the auxiliary power supply (for example, a battery back up, or "BBU"), the ARY 5V OK L signal is asserted. It will be assumed herein that the ARY 5V OK L signal is always asserted.

When the power from the normal system power supply is interrupted, the ARY DC OK L signal is negated and a battery back up (BBU) circuit (not shown) pulls up signal line 206. In response, an inverter 308 transmits a high signal which energizes the data input terminal of a flipflop 202. Preferably, the ARY DC OK L signal is negated some time before the normal system power supply is unable to supply any power to the system; it is asserted sufficiently far in advance so that, as is conventional, the computer system is able to prepare for an orderly system shut-down.

While refresh operations are occurring as described above under normal system power, an OR gate 213 (FIG. 4C) is de-energized, thereby negating a PWR INV RAS power invalid row address strobe signal. The negated PWR INV RAS signal enables an AND gate 216, which is energized to assert a CLK PWR TST clock power test signal when the REF TIM refresh time signal is asserted by flip-flop 151. When the CLK PWR TST is asserted, it clocks flip-flop 202 and a second flip-flop 203. If the ARY DC OK L array direct current OK (asserted low) signal is negated (that is, high) the flip-flop 202 is reset. The low output signal from flip-flop 202 is complemented to couple a high signal to the data input terminal of flip-flop 203. The next time the AND gate 216 asserts the CLK PWR TST clock power test signal, flip-flop 203 is set to assert the PWR INVLD power invalid signal.

The PWR INVLD power invalid signal is coupled to a number of components of the circuitry that generates the control signals for RAM 120 (FIG. 4B) as explained below. In addition, the complement of the PWR INVLD signal is coupled to the data input terminal of a flip-flop 204 through inverter 304(FIG. 4C) so that when the CLK 16 timing signal generated by counter 115 (FIG. 4A) is next asserted, the flip-flop 204 is reset. When flip-flop 204 is reset, it couples a low output signal to the data input terminal of a flip-flop 205, which, on the next assertion of the CLK 16 timing signal, is also reset, which causes an ENABLE signal to be negated. The negated ENABLE signal, in turn, deenergizes an AND gate 208 (FIG. 4C), thereby negating an EN1 enabling signal. The negated EN1 signal is inverted by an inverter 209 to reset flip-flop 152 (FIG. 4C) which disables the remaining circuitry that generates control signals for controlling RAM 120 during normal system power.

The asserted PWR INVLD power invalid signal also enables the RAM 120 control signals to be generated so as to enable refresh operations to occur under auxilliary power, when no SYS CLK system timing signal is being received. This occurs as follows.

While the PWR INVLD power invalid signal is being asserted, when the flip-flop 151 is set to assert the REF TIM refresh time signal, an AND gate 207 (FIG. 4C) is energized. The assertion of the PWR INVLD signal also enables AND gates 212 and 216 (both on FIG. 4C). A DLY delay signal from the output of a delay line 210 is initially negated. The output end of the delay line 210 is connected to an input of an AND gate 211 through an inverter 215. The output of the AND gate 211 is connected to the input terminal of the delay line 210. The energization of AND gate 207 energizes AND gate 211 to transmit an asserted signal into the input of the delay line.

When the leading edge of the signal in delay line 210 reaches a DLY 60 tap, an OR gate 213 is energized to assert a PWR INV RAS power invalid row address strobe (RAS) signal. With reference to FIG. 4B, the asserted PWR INVLD signal energizes an OR gate 171 to, in turn, enable multiplexer 122 to couple the REF ADRS refresh address signals from counter 172 to the address input terminals of random access memory 120. While the PWR INVLD signal is asserted, AND gate 132 is disabled from coupling the PWR OK RAS power OK row address strobe signal to OR gate 133. However, the asserted PWR INVLD signal enables an AND gate 214 so that when the PWR INV RAS power invalid row address strobe signal is asserted by OR gate 213 (FIG. 4C), the OR gate 133 (FIG. 4B) is energized to assert the RAS row address strobe signal. The RAS row address strobe signal enables the refreshing of the row of storage locations in the RAM 20 that is identified by the REF ADRS refresh address signal. The PWR INV RAS signal is asserted until the trailing edge of the signal reaches the output terminal of delay line 210. That is, the PWR INV RAS signal is asserted from the time the DLY 60 tap is energized until the time the DLY signal is negated. While the DLY signal is asserted, an inverter 215 disables AND gate 211, thereby inhibiting a new refresh cycle from starting until after the DLY signal is negated.

When the leading edge of the signal from AND gate 211 reaches a later DLY 120 delay 120 tap on delay line 210, AND gate 212 is energized, causing OR gate 182 to assert the END REF CYC end refresh cycle signal. This in turn resets flip-flop 151 thereby negating the REF TIM refresh time signal, deenergizing AND gates 207 and 211, and thus defining the trailing edge of the signal in delay line 210.

The refresh control circuitry depicted on FIG. 4C also tests the state of the ARY DC OK L array direct current OK (asserted low) signal to determine if the normal system power has returned before every refresh operation. Each time the REF TIM refresh time signal is asserted, before the PWR INV RAS power invalid row address strobe signal is asserted, an AND gate 216 is energized to assert the CLK PWR TST clock power test signal. When normal system power has been returned and the rest of the system is operating normally, the ARY DC OK L array direct current OK signal is asserted (low), and inverter 308 couples a high signal to the data input terminal of flip-flop 202. The flip-flop 202 is set when the CLK PWR TST clock power test signal is first asserted to couple a low signal to the data input terminal of flip-flop 203. When the CLK PWR TST clock power test signal is next asserted, flip-flop 203 is reset to negate the PWR INVLD power invalid signal and thereby disable AND gate 207. Since the SYS CLK system clock signal is restored with the restoration of normal system power, the flip-flops 204 and 205 are set on the first and second assertions, respectively, of the CLK 16 timing signal from binary counter 115 (FIG. 4A). When flip-flop 205 is set, the ENABLE signal is asserted, to enable the AND gate 208 (FIG. 4C). At this point the END CLKD REF CYC end clocked refresh cycle signal is negated, and so AND gate 208 is energized thereby asserting the EN 1 enabling signal. The assertion of the EN1 enabling signal removes the overriding reset signal from flip-flop 152 which has been present since the ENABLE signal was negated, while normal system power has been interrupted and permits normal powered refresh operations to be restored under timing control of the SYS CLK system clock signal.

(D) Transfers Between Memory Controller 15 and Arrays 16

It will be appreciated by those skilled in the art that the array 16 depicted in FIGS. 4A–4C can latch the DATA, ARY ADRS array address and control signals to enable it to perform a READ or WRITE operation even if the array is performing a refresh operation. The particular circuit elements, including latches 102 and 103 and buffer 56 (FIG. 4B) and the circuits which generate the LAT ADD signal (FIG. 4A) are not disabled as a result of the assertion of any of the refresh signals, including the REF CYC refresh cycle, REF RQST refresh request and REF TIM refresh time signals.

Since clocked refresh operation under normal power conditions are handled by the arrays 16 independent (except for the SYS CLK system timing signal) of and transparent to the memory controller 15, the timing of a memory operation will not be constant, as the operation may be delayed a variable amount of time by a refresh operation although the signals initiating the read or write operation have been latched by the array.

Thus, in one embodiment of memory 11, in which the memory controller 15 is controlled by a microsequencer (not shown) that is, in turn, controlled by microcode, a memory array 16 which is performing a read operation negates the ARRAY RD BUSY array read busy signal (see FIG. 3) a selected number of ticks of the SYS CLK system timing signal before it actually has the read data available. During either a read or a write operation, the ARY AVAIL signal is initially negated and then asserted several ticks before the end of the operation. The number of ticks depends upon how long the memory chips comprising RAM 120 take to perform the required operation.

With reference to FIG. 4A, when the LAT ADD latch address signal is first asserted, neither the CLK 5 timing signal nor the MEM CYC IN PROG memory cycle in progress signal is asserted. Accordingly, an AND gate 220 (FIG. 4A) is disabled, thereby enabling an AND gate 221. When the LAT ADD signal is asserted the AND gate 221 is energized to enable the data input terminal of a flip-flop 222. The complement of the output signal of flip-flop 222 comprises the ARY AVAIL array available signal. At the next tick of the SYS CLK signal, flipflop 222 is set, negating the ARY AVAIL signal.

Simultaneously, when the operation is a WRITE operation, the ARY WRT EN array write enable signal on line 57 (FIGS. 3 and 4B) is asserted. If the particular array is to perform the WRITE operation, the controller energizes the array's ARY SEL array select line 66. In response, AND gate 229 is energized, causing the latch 103 to transmit an asserted output signal which is latched when the LAT ADD signal is asserted. If the operation is a READ operation, the ARY WRT EN signal is negated, as are the output signals from AND gate 229 and, thus, latch 103.

If the operation is a read operation, the output signal of latch 103 is negated, and so a LAT READ latched read signal is asserted by an inverter 239 (FIG. 4B). If the REF CYC refresh cycle signal is asserted, or if the CLK 4 signal is not asserted, an AND gate 230 is de-energized. The de-energized AND gate 230 enables one input of an AND gate 231 through an inverter 330. The asserted LAT ADD signal enables the second input of the AND gate 231. When the LAT READ latched read signal is asserted, AND gate 231 is energized to transmit an asserted signal to enable the data input terminal of a flip-flop 232. The asserted output signal from AND gate 231 is then latched by flip-flop 232 at the next tick of the SYS CLK system timing signal, resulting in the assertion of the ARY RD BUSY array read busy signal. The ARY RD BUSY signal is transmitted by the array to memory controller 15 (FIGS. 2 and 3).

In one embodiment of the array 16 depicted in FIGS. 4A–4C, the memory chips comprising RAM 120 provide the read data a selected time following the CLK 4 timing signal, specifically three ticks of the SYS CLK system timing signal after the assertion of the CLK 4 timing signal. Thus, if the REF CYC refresh cycle signal is negated, indicating that no refresh operation is taking place, when the CLK 4 timing signal is asserted, AND gate 230 is energized, which disables AND gate 231. At the next tick of the SYS CLK signal, flip-flop 232 is reset, negating the ARY RD BUSY signal. It should be noted that if the CLK 4 signal had been asserted during a refresh operation, the negated complement of the asserted REF CYC signal would have inhibited AND gate 230 from being energized in response to the assertion of the CLK 4 timing signal, and so the ARY RD BUSY signal would remain asserted. Thus, it will be appreciated that if a refresh operation is in progress and a read operation has been received by the array, the ARY RD BSY array read busy signal will remain asserted through the remainder of the refresh operation and will not be negated until the appropriate time in the array's later performance of the read operation.

When the ARY RD BUSY array read busy signal is negated, the memory controller senses the negation at the next tick of the SYS CLK system timing signal. In the absence of a refresh operation. This sensing occurs at the sixth tick after the beginning of the READ operation. If the READ operation is delayed by a refresh operation, this occurs at the sixth tick after the array 16 begins performing the READ operation after the end of the refresh operation. Specifically, the microsequencer controlling the memory controller senses the negation of the ARY RD BUSY signal and establishes a data path from the array bus 17 to the memory controller's cache memory 30. This occurs during the seventh tick of the SYS CLK signal.

During the eighth tick of the SYS CLK system timing signal, control logic 54 enables the data buffer 56 to load data from the storage locations. The microsequencer uses the ARY RD DAT EN array read data enable and ARY SHIFT signals to enable data buffer 56 to, on subsequent ticks of the SYS CLK system clock signal, shift out the data onto array bus 17. The memory controller 15 then latches the data as it is being shifted.

With reference again to FIG. 4A, AND gate 220 is enabled by the asserted MEM CYC IN PROG memory cycle in progress signal. When the CLK5 timing signal is asserted, the AND gate is enabled, which in turn disables AND gate 221. It will be appreciated, since that the MEM CYC EN PROG signal is negated during refresh operations, AND gate 220 will be de-energized during refresh operations, and so the ARY AVAIL signal will not be asserted. At the next tick of the SYS CLK signal, flipflop 222 is reset, enabling the array's ARY AVAIL array available signal to be asserted. At that point, the memory controller may begin initiating another memory operation with the array.

The invention thus provides a memory, including a controller and one or more arrays, in which the arrays perform refresh operations synchronized to the system clock during normal system power conditions, and independent of any system timing signals during interruption of system power. The refresh operations are transparent to the memory controller and the communications protocol between the controller and arrays accommodates delays due to the refresh operations.

The foregoing description is limited to a specific embodiment of this invention. It will be apparent, however, that this invention can be practiced in systems having diverse basic construction or that use different internal circuitry than is described in the specification with the attainment of some or all of the advantages of this invention. Therefore, it is the object of the appended claims to cover all such variations as come within the true spirit and scope of this invention.

What is claimed as new and desired to be secured by Letters Patent of the United States is:

1. A memory array for connection to a memory controller in a digital data processing system that performs memory operations in response to signals from said memory controller and that also performs refresh operations, the memory controller transmitting to the array control signals including a system timing signal and a power status signal having a power interruption condition and a power operating condition, the array comprising storage means including means for performing a refresh operation in response to control signals therefor, means for performing a memory operation and further comprising:

A. refresh timing means for periodically generating a refresh enabling signal;
B. synchronized refresh means connected to said refresh timing means and said storage means and connected to receive said system timing signal for generating control signals for enabling said storage means to perform a refresh operation in synchronism with said system timing signal; and
C. asynchronous refresh means responsive to said power status signal for disabling said synchronized refresh means in response to the power status signal having the power interruption condition and including timing means for generating refresh control signals in response thereto and to said refresh enabling signal and coupling them to enable said storage means to perform a refresh operation.

2. A memory array as defined in claim 1 further comprising power restoration means connected to said asynchronous refresh enabling means and connected to receive the power status signal and system timing signal for disabling said asynchronous refresh enabling means and enabling said synchronized refresh means when said power status signal shifts from the power interruption condition to the power operating condition and in synchronism with the system timing signal.

3. A memory array for connection to a memory controller in a digital data processing system that performs memory operations in response to signals therefor from said memory controller and that also performs refresh operations, the memory controller transmitting to the array signals including data signals, address signals, and control signals including a system timing signal and a power status signal having a power interruption condition and a power operating condition, the array comprising:

A. a random access memory including a plurality of addressable storage locations for storing data, means for performing a storage operation, and means for performing a refresh operation while performing each storage operation;
B. means for receiving the data, address and control signals, including the system timing signal, from the memory controller;
C. refresh timing means for periodically generating a refresh enabling signal;
D. synchronized refresh means connected to said refresh timing means and connected to receive said system timing signal for generating a synchronized refresh enabling signal in response to said refresh enabling signal and said system timing signal;
E. control means comprising:
   i. operation enabling means responsive to the received control signals and said synchronized refresh enabling signal for enabling said random access memory to perform a storage operation in synchronism with said system timing signal and for generating a memory operation status signal in response thereto;
   ii. means responsive to said synchronized refresh enabling signal for disabling said operation enabling means in response to the synchronized refresh enabling signal and for disabling said synchronizing refresh means in response to said memory operation status signal;
   iii. power status means responsive to said power status signal for disabling said synchronized refresh means in response to said power status signal having the power interruption condition, said power status means including means responsive to said power status signal shifting from said power interruption condition to said power operating condition and further being responsive to said system timing signal for enabling said synchronized refresh enabling means in synchronizm with said system timing signal; and
   iv. asynchronous refresh means connected to said power status means for enabling said random access memory to perform a storage operation to effectuate a refresh operation when said power status signal has the power interruption condition.

4. A memory array as defined in claim 1 wherein said storage means includes a plurality of addressable storage locations, said memory controller transmitting address signals to identify one of said addressable storage locations, a start signal to initiate a memory operation, and an operation signal to identify a memory operation, said storage means further including:

A. address latch means responsive to the receipt of said start signal for latching said address signals and transmitting the latched address signals to said addressable storage locations;
B. operation latch means responsive to the receipt of said start signal for latching the operation signal and coupling the latched operation signal to said addressable storage locations
C. timing signal generating means for receiving said system timing signal and generating signals representing a plurality of successive control states; and
D. address strobe means responsive to one of said control states for generating address strobe signals enabling said addressable storage locations to use the address signals from said address latch means to perform an operation identified by said latched operation signal.

5. A memory array as defined in claim 4 wherein one memory operation is a read operation in which the contents of a storage locaiton identified by said latched address signals are transmitted tosaid memory controller, said memory array further comprising means responsive to said latched operation signal indicating a read operation for transmitting during a control state a signal to said memory controller in synchronism with the transmitssion of the data to said memory controller.

6. A memory array as defined in claim 4 wherein one memory operation is a write operation in which data is stored in an addressable storge location identified by said latched address signals, said memory array further comprising data latch means for latching data from said memory controller when said latched operation signal indicates a write operation.

7. A memory array as defined in claim 4 wherein said synchronized refresh means includes means responsive to said refresh enabling signal for generating a refresh request signal, said memory array further comprising:

A. refresh address means for generating refresh address signals; and

B multiplexer means connected to selectively couple either the refresh address signal during a predetermined control state or the latched address signals to said addressable storage locations in response to the condition of said refresh request signal 8. A memory array as defined in claim 7 wherein said asynchronous refresh means includes means responsive to the power status signal having the power interruption condition for generating a power invalid signal, said multiplexer means being responsive to the generation of said power invalid signal to couple said refresh address signals to said addressable storage locations.

9. A memory array as defined in claim 8 wherein said timing means in said asynchronous refresh includes delay line means for generating a refresh control signal enabling said address strobe means to generate an address strobe signal, said delay line means being enabled in response to said refresh enabling signal and said power invalid signal.

10. A memory array as defined in claim 9 wherein further comprises power test means for testing the condition of said power status signal in response to the generation of said refresh control signal.

11. A memory array as defined in claim 3 wherein control signals transmitted by said memory controller include a start signal to initiate a memory operation, and an operation signal to identify a memory operation, A. said receiving means including:

i. address latch means responsive to the receipt of said start signal for latching said address signals and transmitting the latched address signals to said addressable storage locations;

ii. operation latch means responsive to the receipt of said start signal for latching the operation signal and coupling the latched operation signal to said addressable storage locations iii. timing signal genrating means for receiving said system timing signal and generating signals representing a plurality of successive control states; and B. said operation enabling means including address strobe means responsive to one of said control states for generating address strobe signals enabling said addressable storage locations to use the address signals from said address latch means to perform an operation identified by said latched operation signal.

12. A memory array as defined in claim 11 wherein one memory operation is a read operation in which the contents of a storage locaiton identified by said latched address signals are transmitted to said memory controller, said operation enabling means further comprising means responsive to said latched operation signal indicating a read operation for transmitting during a control state a signal to said memory controller in synchronism with the transmitssion of the data to said memory controller.

13. A memory array as defined in claim 11 wherein one memory operation is a write operation in which data is stored in an addressable storage location identified by said latched address siganls, said receiving means further comprising data latch means for latching data from said memory controller when said latched operation signal indicates a write operation.

14. A memory array as defined in claim 13 wherein said synchronized refresh means includes means responsive to said refresh enabling siganl for generating a refresh request signal, said memory array further comprising:

A. refresh address means for generating refresh address signals; and

B. multiplexer means connected to selectively couple either the refresh address signals during a predetermined control state or the latched address signals to said addressable storage locations in response to the condition of said refresh request signal.

15. A memory array as defined in claim 14 wherein said asynchronous refresh means includes means responsive to the power status signal having the power interruption condition for generating a power invalid signal, said multiplexer means being responsive to the generation of said power invalid signal to couple said refresh address signals to said addressable storage locations.

16. A memory array as defined in claim 15 wherein said timing means in said asynchronous refresh means includes delay line means for generating a refresh control signal enabling said address strobe means to generate an address strobe signal, said delay line means being enabled in response to said refresh enabling signal and said power invalid signal.

17. A memory array as defined in claim 16 wherein further comprises power test means for testing the condition of said power status signal in response to the generation of said refresh control signal.

* * * * *

UNITED STATES PATENT AND TRADEMARK OFFICE

CERTIFICATE OF CORRECTION

PATENT NO. : 4,700,330

DATED : October 13, 1987

INVENTOR(S) : Barbara H. Altman, William F. Bruckert, Alfred J. Dellicichi

It is certified that error appears in the above-identified patent and that said Letters Patent is hereby corrected as shown below:

The sheet of drawing, consisting of FIG. 4C, should be added as shown on the attached sheet.

Signed and Sealed this

Thirtieth Day of April, 1991

*Attest:*

HARRY F. MANBECK, JR.

*Attesting Officer*

*Commissioner of Patents and Trademarks*